(12) United States Patent
Zhang

(10) Patent No.: US 7,835,200 B2
(45) Date of Patent: Nov. 16, 2010

(54) LEVEL SHIFTER

(75) Inventor: Ruili Zhang, Folsom, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 131 days.

(21) Appl. No.: 12/346,454

(22) Filed: Dec. 30, 2008

(65) Prior Publication Data

US 2010/0165752 A1 Jul. 1, 2010

(51) Int. Cl.
*G11C 5/14* (2006.01)
(52) U.S. Cl. .............................. 365/189.09; 365/189.11
(58) Field of Classification Search ............ 365/189.11, 365/189.09, 226; 327/333
See application file for complete search history.

(56) References Cited

U.S. PATENT DOCUMENTS 5,166,758 A 11/1992 Ovshinsky et al.
6,181,606 B1 * 1/2001 Choi et al. ............. 365/185.23
6,587,375 B2 * 7/2003 Chung et al. ........... 365/185.13
7,280,414 B2 * 10/2007 Kato ...................... 365/189.09

* cited by examiner

*Primary Examiner*—Gene N. Auduong
(74) *Attorney, Agent, or Firm*—Lisa K. Jorgenson; Robert Iannucci; Seed IP Law Group PLLC

(57) ABSTRACT

A level shifter circuit includes first and second supply inputs for receiving a first supply voltage and a second supply voltage, respectively. The level shifter circuit further comprises a shifting circuit configured to receive an input voltage and output a selected one of the first supply voltage and the second supply voltage according to the value of the input voltage. The shifting circuit includes a circuit branch connected between the first supply input and the second supply input. The circuit branch includes a plurality of series-connected electronic devices and a voltage dropper device connected in series with the plurality of electronic devices for introducing a voltage drop. The level shifter circuit includes a bias generator configured to generate a bias voltage for the voltage dropper device according to values of the first supply voltage and the second supply voltage, said voltage drop depending on the bias voltage.

22 Claims, 3 Drawing Sheets

LEVEL SHIFTER

BACKGROUND

1. Technical Field

The present disclosure relates to the semiconductor memory device field. More specifically, the present invention relates to level shifters.

2. Description of the Related Art

Semiconductor memory devices are commonly used to store information (either temporarily or permanently) in a number of applications; particularly, in a non-volatile memory device the information is preserved even when a power supply is off. Typically, the memory device includes a matrix of memory cells that are arranged in a plurality of rows (connected to corresponding word lines) and in a plurality of columns (connected to corresponding bit lines).

For example, an ovonic or phase-change memory (PCM) is a non-volatile memory exploiting the properties of a material that can be reversibly switched between an amorphous phase and a crystalline phase, such as a chalcogenide alloy. A PCM could be characterized as an $E^2PROM$ because it is non-volatile and electrically alterable. The phase-change material exhibits different electrical characteristics depending on its phase, each one representing a corresponding logic value. An example of a phase-change memory is described in U.S. Pat. No. 5,166,758.

In order to retrieve and/or store information, the phase-change memory device includes a decoding system that is configured to decode an addressing code identifying a group of memory cells. Based on the decoded addressing code, the decoding system drives a selection system, which accordingly selects the identified memory cells for performing a programming or a reading operation. In particular, the selection system includes a row selector for selecting a corresponding word line and a column selector for selecting a corresponding set of bit lines. Particularly, the column selector includes a plurality of controllable switching elements each for selectively connecting a corresponding bit line to a read and write circuit, configured to bias said bit line with a voltage whose value depends on the operation to be performed.

The decoder system operates with logical signals at low voltages, of the order of a supply voltage of the phase-change memory device; for example, the logical signals can take two values equal to a reference voltage (0) or to the supply voltage (1).

To generate sufficient heat to convert the phase change material between amorphous and crystalline states, the selection system is able to apply operative voltages of high value to the selected memory cells. These voltages are higher than the supply voltage (in absolute value). For example, in single supply voltage memory devices, the high voltages are generated inside the phase-change memory device from the supply voltage, by means of suitable circuits, such as charge pumps. Thus, the selection system usually includes level shifters, which are configured to convert logical signals output from the decoding system into the high voltages necessary during the programming and erasing operations. For example, during a programming operation, for selecting a set of bit lines and connecting them to the read and write circuits, the switching elements of the column selector are controlled with high voltages, so as to allow the read and write circuits to bias the selected bit lines with the voltages higher than the supply voltage; for this purpose, each switching element is controlled by a respective level shifter, which is configured to shift the logic signals provided by the decoding system to a level suitable for activating the switching element.

Therefore, the components forming said level shifter, such as MOS transistors, have to sustain between their terminals high voltage differences, that exceed the value of the supply voltage.

As is well known to those skilled in the art, if a MOS transistor is subjected to high gate-to-source and/or gate-to-drain voltage differences, its operative life is heavily shortened, since the oxide gate experiences an excessive stress. This excessive stress may cause the oxide gate to break, impairing the correct functioning of the level shifters and, thus, of the whole memory device.

BRIEF SUMMARY

In view of the above the Applicant has tackled the problem of improving the known solutions for implementing level shifter circuits.

More specifically, one embodiment provides a level shifter circuit comprising first and second supply inputs for receiving a first supply voltage and a second supply voltage, respectively. The level shifter circuit further comprises a shifting circuit configured to receive an input voltage and output a selected one of the first supply voltage and the second supply voltage according to the value of the input voltage. The shifting circuit includes at least one circuit branch connected between the first supply input and the second supply voltage. Said circuit branch includes a respective plurality of series-connected electronic devices. Said circuit branch further includes at least one voltage dropper device connected in series with the plurality of electronic devices for introducing a voltage drop. Said level shifter circuit includes a bias generator configured to generate a bias voltage for the voltage dropper device according to the values of the first supply voltage and the second supply voltage, said voltage drop depending on the bias voltage.

One embodiment provides a column selector.

One embodiment provides a semiconductor memory device.

One embodiment provides a corresponding level shifting method.

One embodiment provides a column selection method.

One embodiment provides a method for managing a semiconductor memory device.

One embodiment provides an electronic system.

BRIEF DESCRIPTION OF THE SEVERAL VIEWS OF THE DRAWINGS

The invention itself, as well as further features and the advantages thereof, will be best understood with reference to the following detailed description, given purely by way of a non-restrictive indication, to be read in conjunction with the accompanying drawings. Particularly.

DETAILED DESCRIPTION

Figure 1:
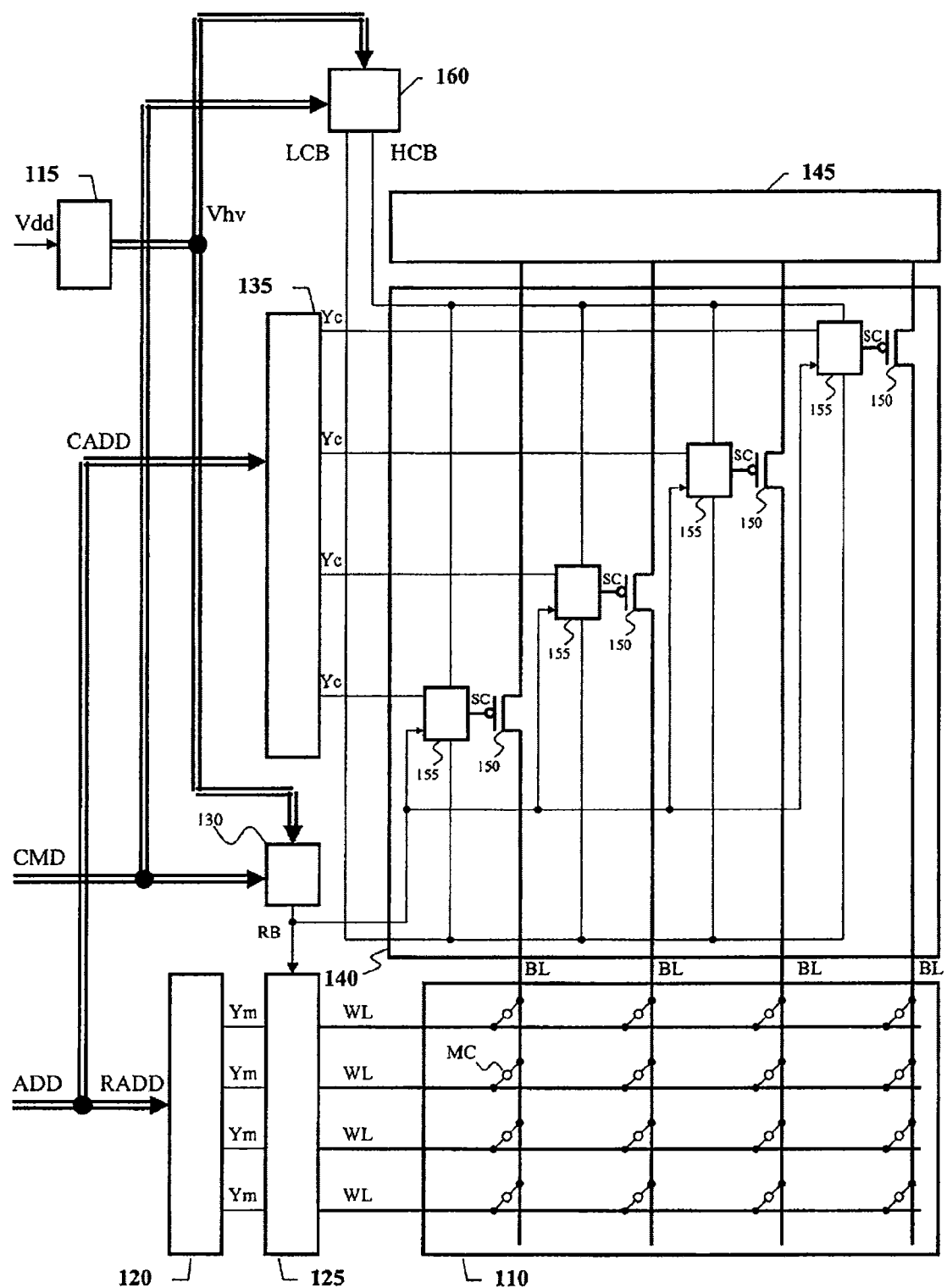
FIG. 1 schematically illustrates a semiconductor memory according to an embodiment.

In the following, a solution according to exemplary and non-limitative embodiments will be presented and described in detail. Those skilled in the art will however recognize that several modifications to the described embodiments are possible.

FIG. 1 schematically illustrates a semiconductor memory 100 according to an embodiment.

The semiconductor memory 100 includes a memory array 110 comprising a plurality of non-volatile memory cells MC arranged in rows and columns. The semiconductor memory 100 includes a plurality of bit lines BL, each one associated with a column of the memory array 110, and a plurality of word lines WL, each one associated with a row of the memory array 110.

According to an exemplary embodiment, the semiconductor memory 100 is phase change memory (PCM). In this case, each memory cell MC is made of a phase-change material; typically, the phase-change material consists of a chalcogenide (such as an alloy $Ge_2Sb_2Te_5$). Without descending to particulars well known in the art, the phase-change material can be reversibly switched between a generally amorphous, disordered phase and a generally crystalline, high ordered phase. The two phases of the material exhibit different electrical characteristics; particularly, the material in the amorphous phase has a high resistivity (defining a reset state associated with a first logic value, for example, "0"), whereas the material in the crystalline phase has a low resistivity (defining a set state associated with a second logic value, for example, "1"). It has to be appreciated that the present invention is in no way limited to the phase change memories, the concept thereof being applicable to any non-volatile memory.

The semiconductor memory 100 is configured to manage operations to be performed on the memory cells MC in response to commands CMD and addresses ADD received from the outside of the memory. Based on the received command CMD, the semiconductor memory 100 is capable of determining an operation (for example, a reading or a writing operation) to be performed on selected memory cells MC of the memory array 110 identified by the specific address ADD that has been received. The semiconductor memory 100 is capable of simultaneously reading/programming a word. The bits of each word are stored in memory cells MC associated with a single word line WL and a set of bit lines BL. For this purpose, the address ADD comprises two address portions, namely, a row address RADD and a column address CADD; each word line WL is identified by a respective row address RADD, while each set of bit lines BL is identified by a respective column address CADD.

The semiconductor memory 100 further includes a PMU (acronym for Power Management Unit) 115. The PMU 115 provides the biasing voltages that are used for performing the conventional operations (such as reading and programming operations) on the semiconductor memory 100. The PMU 115 receives a supply voltage Vdd (such as 1.8V) from the outside and outputs different operative voltages Vhv; the operative voltages Vhv are generally higher in absolute value than the supply voltage Vdd, for example, ranging from −2V to 6V. For this purpose, the PMU 115 includes circuitry (e.g., charge pumps) configured to generate the operative voltages Vhv from the supply voltage Vdd.

The selection of the desired word line WL is carried out by means of a row decoder 120 and a row selector 125.

The row decoder 120 receives the row address RADD, and accordingly generates a plurality of row-selection signals Yr each associated with a respective word line WL. In detail, the row decoder determines the word line WL that is identified by the received row address RADD, and asserts—for example, to the supply voltage Vdd—the row-selection signal Yr associated therewith; the other row-selection signals Yr are instead deasserted—for example, to a reference voltage such as the ground voltage.

The row selector 125 is coupled with the row decoder 120 for receiving the row-selection signals Yc; moreover, the row selector 125 is further coupled with the word lines WL for biasing them according to the received row-selection signals Yc. Particularly, the word line WL associated with the asserted row-selection signals Yc is biased to a row selection voltage RSV, while the other word lines WL are biased to a row deselection voltage RDV. The values of said row selection voltage RSV and row deselection voltage RDV depend on the operation to be performed; as already mentioned in the introduction of the present document, said voltages may be higher (in absolute value) than the supply voltage Vdd.

For this purpose, the row selector 125 is fed with a selected one among the operative voltages Vhv according to the operation to be performed. Particularly, the semiconductor memory 100 includes a row bias switch 130 having first inputs coupled with the PMU 115 for receiving the operative voltages Vhv and control inputs receiving the command CMD which identifies the operation to be performed. Based on the received command CMD, the row bias switch 130 selects an operative voltage Vhv, and accordingly provides a row bias voltage RB corresponding (e.g., equal) to said selected operative voltage Vhv to the row selector 125. Without descending into details well known to those skilled in the art, the row bias voltage RB is used by the row selector 125 for generating the row selection voltage RSV and the row deselection voltage RDV. Each operation to be performed on the memory cells MC involves the selection of a respective operative voltage Vhv. Since the values of the row selection voltage RSV and of the row deselection voltage RDV depend on the row bias voltage RB, with this arrangement the values of the former voltages are automatically set based on the operation to be performed.

For example, during a programming operation, a selected word line WL may need to be biased with a relatively high selection voltage RSV. When selected during a reading operation, the same word line WL may need to be biased with a lower selection voltage RSV. In the first case, a high operative voltage Vhv is selected by the row bias switch 130, in such a way that the row selector 125 is fed with a high row bias voltage RB. In the second case, the row bias switch 130 may select a lower operative voltage Vhv, in such a way to provide a lower row bias voltage RB.

The selection of the desired set of bit lines BL is instead carried out by means of a column decoder 135 and a column selector 140.

The column decoder 135 receives the column address CADD, and accordingly generates a plurality of column-selection signals Yc, each associated with a respective bit line BL. The column decoder 135 determines the set of bit lines BL identified by the received column address CADD, and asserts—e.g., to the ground voltage—the column selection signals Yc associated with said bit lines BL; the other column selection signals Yc are instead deasserted—e.g., to the supply voltage Vdd.

The column selection signals Yc are provided to the column selector 140, which accordingly enables the bit lines BL associated with the asserted column selection signals Yc by connecting them to a Read/Program (R/P) circuit 145 that includes all the components (e.g., sense amplifiers, comparators, reference current/voltage generators, pulse generators, program load circuits and the like) which are normally used for programming the desired logic values into the selected memory cells MC and for reading the logic values currently stored therein. The other bit lines BL are instead kept insulated from the R/P circuitry 145.

The column selector 140 includes a plurality of controlled column switches 150 (e.g., p-channel MOS transistors) each associated with a respective bit line BL and configured to selectively connect said bit line BL to the R/P circuitry 145 according to the column selection signals Yc. In detail, each column switch 150 has a first conduction terminal connected to the respective bit line BL, a second conduction terminal connected to the R/P circuitry 145 and a control terminal connected to a respective level shifter 155 for receiving a column switch control signal SC generated according to the column selection signals Yc associated with said bit line BL. As already mentioned in the introduction of the present document, the column switches 150 are controlled with voltages higher (in absolute value) than the supply voltage Vdd, so as to allow the R/P circuitry 145 to bias the selected bit lines BL with the voltages higher than the supply voltage Vdd. For this purpose, instead of directly providing the column selection signals Yc to the control terminals of the respective column switches 150, each column selection signal Yc is fed to a respective level shifter 155, which accordingly shifts said column selection signal Yc to a level suitable for activating the respective column switch 150.

If a column selection signal Yc is deasserted by the column decoder 135, i.e., if it is brought to the supply voltage Vdd, the respective level shifter 155 brings the control signal SC to a column deselection voltage HCB, whose value depends on the operation to be performed and may be higher than the supply voltage Vdd. In this way, the respective column switch 150 is kept off, and the corresponding bit line BL is disconnected from the R/P circuitry 145. Similarly, if a column selection signal Yc is asserted by the column decoder 135, i.e., if it is brought to the ground voltage, the respective level shifter 155 brings the control signal SC to a column selection voltage LCB, whose value depends on the operation to be performed, and may be higher (in absolute value) than the supply voltage Vdd. In this way, the respective column switch 150 is activated, and the corresponding bit line BL is connected to the R/P circuitry 145 for being biased according to the operation to be performed. It is assumed that the column deselection voltage HCB is higher than the column selection voltage LCB. For example, during a reading operation, the column deselection voltage HCB may be equal to 3.6 V, while the column selection voltage LCB may be equal to −2.4 V; furthermore during a programming operation, the column deselection voltage HCB may be equal to 6 V, while the column selection voltage LCB may be equal to −2.6 V.

For this purpose, all the level shifters 155 are coupled with a column bias switch 160, which provides the column deselection voltage HCB and the column selection voltage LCB. In the same way as the row bias switch 130, the column bias switch 160 has first inputs coupled with the PMU 115 for receiving the operative voltages Vhv and control inputs receiving the command CMD which identifies the operation to be performed. Based on the received command CMD, the column bias switch 160 selects a pair of operative voltages Vhv, and accordingly provides the column deselection voltage HCB and the column selection voltage LCB corresponding (e.g., equal) to said selected operative voltages Vhv.

In this way, based on the column selection signals Yc, the column switches 150 are controlled with column deselection voltages HCB or column selection voltages LCB whose values are automatically set based on the operation to be performed.

Figure 2:
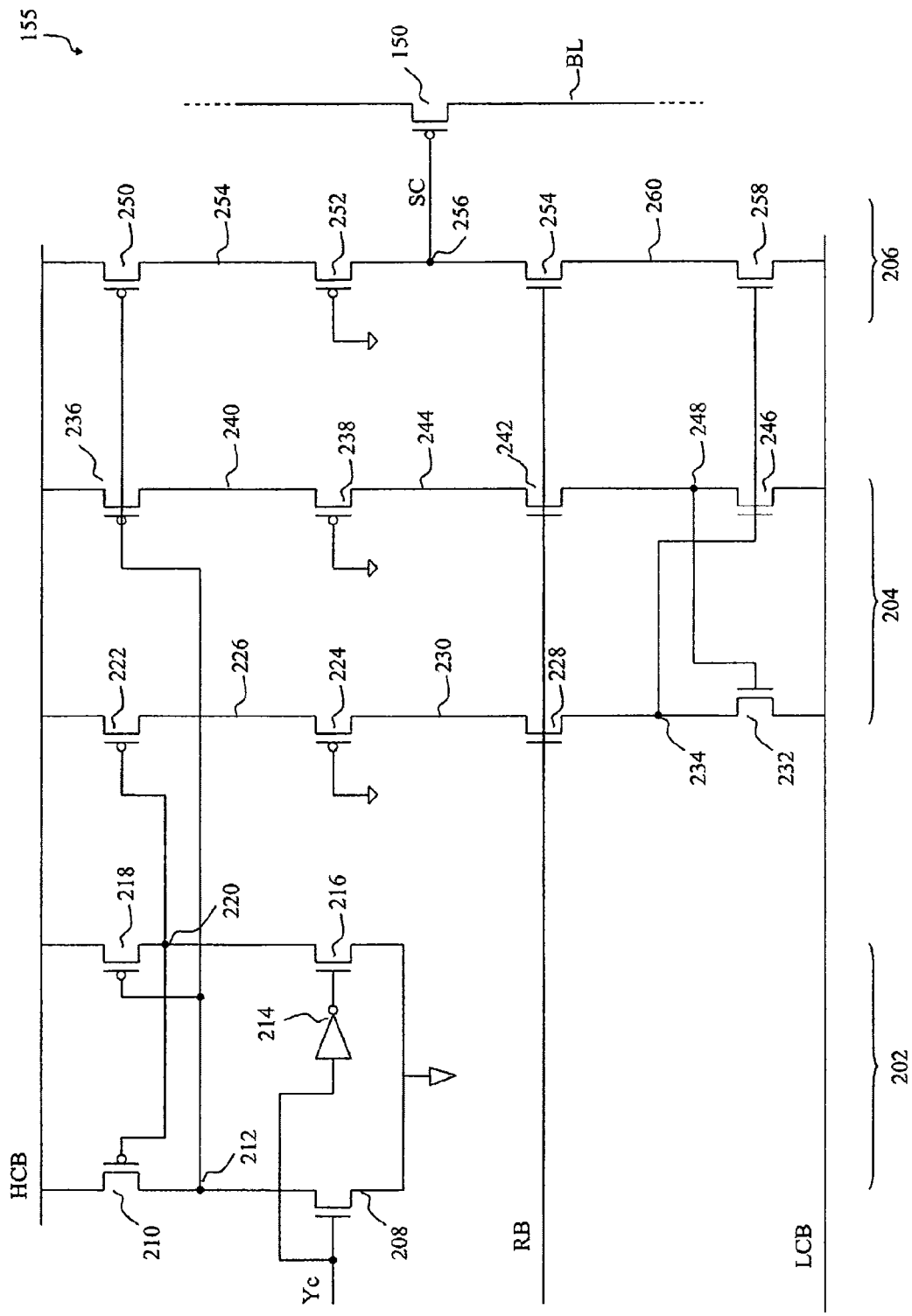
FIG. 2 illustrates the circuit structure of a level shifter used in the semiconductor memory of FIG. 1 according to an embodiment.

FIG. 2 illustrates in greater detail the circuit structure of a level shifter 155 according to an embodiment.

The level shifter 155 has a first input for receiving the respective column selection signal Yc, second and third inputs coupled with the column bias switch 160 for receiving the column deselection voltage HCB and the column selection voltage LCB, and an output connected to the control terminal of the respective column switch 150 for providing the column deselection voltage HCB or the column selection voltage LCB according to the received column selection signal Yc. According to an embodiment of the present disclosure, the level shifter 155 has a further input coupled with the row bias switch 130 for receiving the row bias voltage RB, for being used as described in the following of the present description.

The level shifter 155 is comprised of three main stages, namely a first level shift stage 202, a second level shift stage 204 and an output stage 206. The first level shift stage 202 is configured to increase the range between the two values that the column selection signal Yc is capable of assuming—i.e., the ground voltage and the supply voltage Vdd—by a first amount, in such a way to bring said range to start from the ground voltage and end to the column deselection voltage HCB. The second level shift stage 204 is configured to further increase said range by a second amount, in such a way to bring it to start from the column selection voltage LCB and end to the column deselection voltage HCB. The output stage 206 is configured to selectively provide either the column deselection voltage HCB or the column selection voltage LCB based on the voltages assumed by the second level shift stage 204.

According to an embodiment, the first level shift stage 202 includes an n-channel MOS transistor 208 having a ground terminal connected to a terminal providing the ground voltage, a gate terminal connected to the column decoder 135 for receiving the respective column selection signal Yc, and a drain terminal connected to the drain terminal of a p-channel MOS transistor 210 (circuit node 212). The first shift stage 202 further includes an inverter logic gate 214, having an input connected to the gate terminal of the transistor 208 for receiving the column selection signal Yc and an output terminal connected to a gate terminal of a further n-channel MOS transistor 216. The transistor 216 has a source terminal connected to a terminal providing the ground voltage and a drain terminal connected to the drain terminal of a p-channel MOS transistor 218 (circuit node 220). The transistor 210 has a gate terminal connected to the circuit node 220 and a source terminal connected to the column bias switch 160 for receiving the column deselection voltage HCB. The transistor 218 has a gate terminal connected to the circuit node 212 and a source terminal connected to the column bias switch 160 for receiving the column deselection voltage HCB.

The second level shift stage 204 comprises a p-channel MOS transistor 22 having a source terminal connected to the column bias switch 160 for receiving the column deselection voltage HCB, a gate terminal connected to the circuit node 220 and a drain terminal connected to a source terminal of a further p-channel MOS transistor 224 (circuit node 226). The transistor 224 has a gate terminal connected to a terminal providing the ground voltage and a drain terminal connected to a drain terminal of an n-channel MOS transistor 228 (circuit node 230). The transistor 228 has a source terminal connected to a drain terminal of a further n-channel MOS transistor 232 (circuit node 234) and a gate terminal receiving the row bias voltage RB. The transistor 232 has a source terminal connected to the column bias switch 160 for receiving the column selection voltage LCB. The second level shift stage 204 further includes a p-channel MOS transistor 236 having a source terminal connected to the column bias switch 160 for receiving the column deselection voltage HCB, a gate terminal connected to the circuit node 212 and a drain terminal connected to a source terminal of a further p-channel MOS transistor 238 (circuit node 240). The transistor 238 has a gate terminal connected to a terminal providing the ground voltage and a drain terminal connected to a drain terminal of an n-channel MOS transistor 242 (circuit node 244). The transistor 242 has a gate terminal receiving the row bias voltage RB and a source terminal connected to a drain terminal of a further n-channel MOS transistor 246 (circuit node 248). The transistor 246 has a source terminal connected to the column bias switch 160 for receiving the column selection voltage LCB and a gate terminal connected to the circuit node 234. The transistor 232 has a gate terminal connected to the circuit node 248.

The output stage 206 comprises a p-channel MOS transistor 250 having a drain terminal connected to the column bias switch 160 for receiving the column deselection voltage HCB, a gate terminal connected to the circuit node 212 and a source terminal connected to a source terminal of a further p-channel MOS 252 (circuit node 254). The transistor 252 has a gate terminal connected to a terminal providing the ground voltage and a drain terminal connected to a drain terminal of an n-channel MOS transistor 254 (circuit node 256). The transistor 254 has a gate terminal receiving the row bias voltage RB and a source terminal connected to a drain terminal of a further n-channel MOS transistor 258 (circuit node 260). The transistor 258 has a gate terminal connected to the circuit node 234 and a source terminal connected to the column bias switch 160 for receiving the column selection voltage LCB.

The circuit node 256 is the output of the level shifter 155, which is connected to the gate terminal of the respective column switch 150 for providing the column switch control signal SC.

The operation of the level shifter 155 will be now described in the following of the present description according to an embodiment.

Particularly, when the column selection signal Yc is deasserted by the column decoder 135 to the supply voltage Vdd, the transistor 208 is turned on, while the transistor 216 is off. Thus, the circuit node 212 is brought to the ground voltage, and the transistor 218 is turned on. As a consequence, the circuit node 220 is brought to the column deselection voltage HCB, and the transistor 210 is kept off.

In this condition, the transistor 222 is turned off, while the transistor 236 is turned on. The circuit node 240 is thus brought to the column deselection voltage HCB. The transistor 238, which is turned on since its gate terminal is biased with the ground voltage, behave as a "voltage reducer", causing a voltage drop—whose amount mainly depends on the gate size of the transistor 238—between the circuit node 240 and the circuit node 244. In the same way, also the transistor 242 behave as a voltage reducer, causing a voltage drop between the circuit node 244 and the circuit node 248; it has to be appreciated that in this case, the amount of such voltage drop depends on both the gate size of the transistor 242 and the value of the row bias voltage RB. Thanks to the presence of the transistors 238 and 242, the circuit node 248 is brought to voltage lower (in absolute value) than the column deselection voltage HCB, but sufficiently high to turn on the transistor 232. In this way, the circuit node 234 is brought to the column selection voltage LCB, and the transistor 246 is turned off. With said bias condition the transistor 258 is turned off, while the transistor 250 is turned on. As a consequence, being the transistor 252 turned on, too—since its gate terminal is biased to the ground voltage—, the circuit node 256, i.e., the output node of the level shifter 155, is brought to a voltage roughly equal to the column deselection voltage HCB.

In this way, the column switch control signal SC is approximately set to the column deselection voltage HCB, and the column switch 150 is turned off, keeping the bit line BL disconnected from the R/P circuitry 145.

When the column selection signal Yc is instead asserted by the column decoder 135 to the ground voltage, the transistor 208 is off, while the transistor 216 is turned on. Thus, the circuit node 220 is brought to the ground voltage, and the transistor 210 is turned on. As a consequence, the circuit node 220 is brought to the column deselection voltage HCB, and the transistor 218 is kept off.

In this condition, the transistor 236 is turned off, while the transistor 222 is turned on. The circuit node 226 is thus brought to the column deselection voltage HCB. The transistor 224, which is turned on since its gate terminal is biased with the ground voltage, behave as a voltage reducer, causing a voltage drop between the circuit node 226 and the circuit node 230. In the same way, also the transistor 228 behave as a voltage reducer, causing a voltage drop between the circuit node 230 and the circuit node 234, with the amount of such voltage drop that depends on both the gate size of the transistor 228 and the value of the row bias voltage RB. Thanks to the presence of the transistors 224 and 228, the circuit node 234 is brought to voltage lower (in absolute value) than the column deselection voltage HCB, but sufficiently high to turn on the transistor 246. In this way, the circuit node 248 is brought to the column selection voltage LCB, and the transistor 232 is turned off. With said bias condition the transistor 250 is turned off, while the transistor 258 is turned on. As a consequence, being the transistor 254 turned on, too—since its gate terminal is biased to the row bias voltage RB, the circuit node 256, i.e., the output node of the level shifter 155, is brought to a voltage roughly equal to the column selection voltage LCB.

In this way, the column switch control signal SC is approximately set to the column selection voltage LCB, and the column switch 150 is turned on, connecting the bit line BL to the RIP circuitry 145.

Thanks to the proposed arrangement, i.e., with the transistors 224, 238, 252, 228, 242 and 254 that acts in a cascode-fashion behaving as voltage reducers, it is assured that all the transistors forming the level shifter 155 are subjected to gate-to-source and gate-to-drain voltage differences lower than the rail-to-rail voltage |HCB|−|LCB|. Therefore, unlike the transistors of the known level shifters, the transistors included in the proposed one are not excessively stressed, and the operative life thereof is increased.

In order to ensure a correct operation, allowing the transistors of the level shifter 155 not to be subjected to excessive gate-to-source and gate-to-drain voltage differences, the transistors 228, 242 and 254 are biased with an adaptive bias voltage that tracks the values of the column selection voltage LCB and the column deselection voltage HCB.

According to the proposed solution there is no need of a dedicated biasing circuit configured to the generation of adaptive bias voltages to be provided to the gate terminals of the transistors 228, 242 and 254. Instead, it is sufficient to use the row bias voltage RB generated by the row bias switch 130. Indeed, there is a relationship between the value of the row bias voltage RB used during a specific operation and the values of the column selection voltage LCB and the column deselection voltage HCB used during the same operation. For example, making reference to the semiconductor memory 100 illustrated in FIG. 1, said relationship may be a direct one. Particularly, when the column deselection voltage HCB is set to a high value during a programming operation, also the row bias voltage RB used by the row selector 125 is set to a relatively high value. During a reading operation, the column deselection voltage HCB is instead set to a lower value; in this case, the row bias voltage RB is set to a lower value as well.

Figure 3:
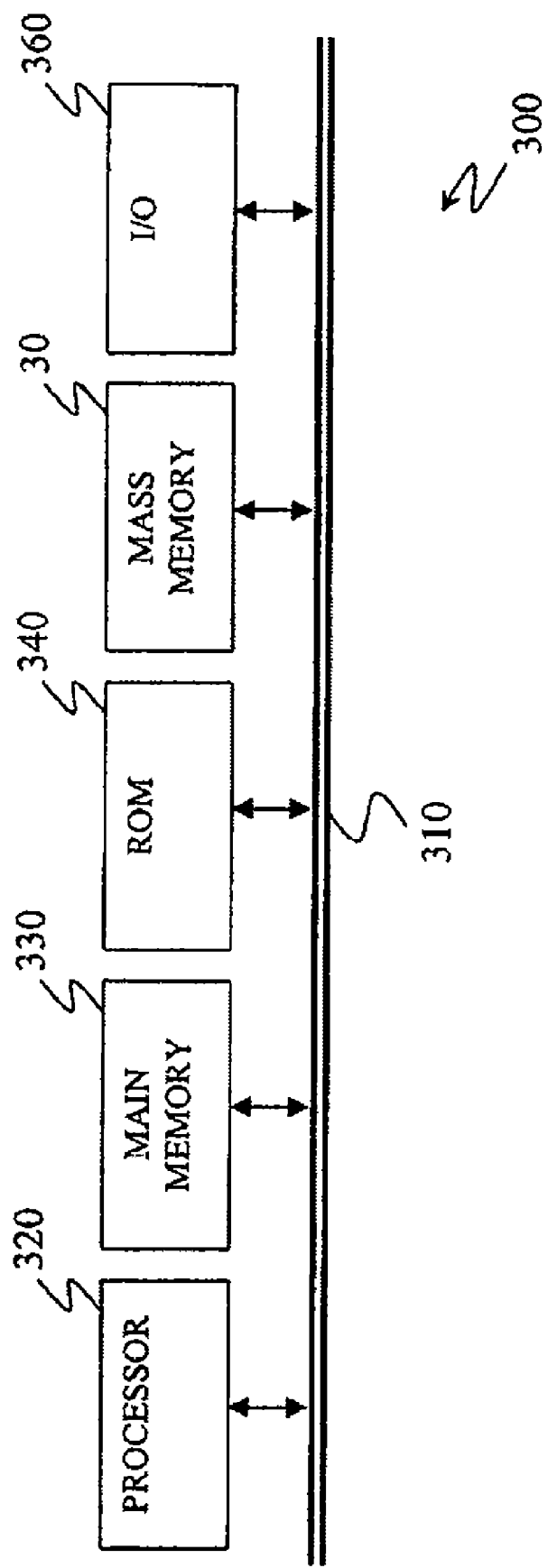
FIG. 3 schematically illustrates a portion of an exemplary electronic system in which the semiconductor memory of FIG. 1 may be used.

FIG. 3 schematically illustrates a portion of an exemplary electronic system 300 according to an embodiment. The electronic system 300 may be for example a computer, a Personal Digital Assistant (PDA), a laptop or portable computer, a digital music player, a digital camera, or other devices that may be configured to exploit an integrated non-volatile memory device.

The electronic system 300 is formed by several units that are connected in parallel to a system or communication bus 310 (with a structure that is suitably scaled according to the actual function of the system 300). In detail, one or more processors 320 control operation of the system 300; a main memory 330 is directly used as a working memory by the processors 320, and a ROM 340 stores basic code for a bootstrap of the system 300. Moreover, the system 300 is provided with a mass memory 350 for storing data and programs, and input/output units 360 for receiving/providing data from/to the outside.

The system 300 may exploit the advantages of the proposed solution by implementing the ROM 340, the main memory 330 and/or the mass memory 450 with at least one semiconductor memory such as the semiconductor memory 100 discussed herein.

Naturally, in order to satisfy local and specific requirements, a person skilled in the art may apply to the solution described above many logical and/or physical modifications and alterations. More specifically, although the present invention has been described with a certain degree of particularity with reference to preferred embodiment(s) thereof, it should be understood that various omissions, substitutions and changes in the form and details as well as other embodiments are possible. Particularly, the proposed solution may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

For example, even if reference has been made to the phase change memory field, the concepts of the present invention can be applied to other types of semiconductor memories, such as erasable and programmable read-only memories, flash memories, RAM memory and the like.

Similar considerations apply if the memory array has a different structure, with the memory cells that are arranged in a different way.

Moreover, even if in the present description the level shifter has been implemented with MOS transistors, similar considerations can be applied to level shifters implemented with different types of transistors, such as BJTs.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A level shifter circuit, comprising:
   first and second supply inputs for receiving a first supply voltage and a second supply voltage, respectively;
   a shifting circuit configured to receive an input voltage and output a selected one of the first supply voltage and the second supply voltage according to a value of the input voltage, the shifting circuit including a circuit branch connected between the first supply input and the second supply input, said circuit branch including a plurality of series-connected electronic devices, and a voltage dropper device connected in series with the plurality of electronic devices and configured to introduce a voltage drop; and
   a bias generator configured to generate a bias voltage for the voltage dropper device according to values of the first supply voltage and the second supply voltage, said voltage drop depending on the bias voltage.

2. The level shifter circuit of claim 1, wherein the shifting circuit comprises:
   a first shift stage connected between the first supply input and a reference input providing a reference voltage, said first shift stage being configured to receive the input voltage and output a first output voltage corresponding to a selected one of the first supply voltage and the reference voltage according to the value of the input voltage; and
   a second shift stage connected between the first supply input and the second supply input, said second shift stage being configured to receive the first output voltage from the first shift stage, and output a second output voltage corresponding to a selected one of the first supply voltage and the second supply voltage according to a value of the first output voltage, said second shift stage including said circuit branch including the voltage dropper.

3. The level shifter of claim 1, wherein the voltage dropper is a transistor having a control terminal configured to receive said bias voltage.

4. The level shifter of claim 1, wherein a value of the bias voltage is in direct relationship with the value of at least one of the first supply voltage and the second supply voltage.

5. A column selector for selecting bit lines of a semiconductor memory device in response to a received address code, the column selector comprising:
   a plurality of switches associated respectively with bit lines and configured to be selectively controlled through corresponding switch control signals, respectively, for selecting the respective bit lines;
   a plurality of level shifters associated respectively with switches and configured to generate the corresponding switch control signals according to respective selection signals based on the address code, wherein each level shifter includes:
   first and second supply inputs for receiving a first supply voltage and a second supply voltage, respectively;
   a shifting circuit configured to receive a corresponding one of the selection signals and set the switch control signal to a selected one of the first supply voltage and the second supply voltage according to a value of the corresponding selection signal, the shifting circuit including a circuit branch connected between the first supply input and the second supply input, said circuit branch including a plurality of series-connected electronic devices and a voltage dropper device connected in series with the plurality of electronic devices and configured to introduce a voltage drop; and a bias generator configured to generate a bias voltage for the voltage dropper device according to values of the first supply voltage and the second supply voltage, said voltage drop depending on the bias voltage.

6. The column selector of claim 5, wherein the shifting circuit of each level shifter comprises:

a first shift stage connected between the first supply input and a reference input providing a reference voltage, said first shift stage being configured to receive the corresponding selection signal and output a first output voltage corresponding to a selected one of the first supply voltage and the reference voltage according to a value of the corresponding selection signal; and a second shift stage connected between the first supply input and the second supply input, said second shift stage being configured to receive the first output voltage from the first shift stage, and set the switch control signal to a voltage corresponding to a selected one of the first supply voltage and the second supply voltage according to a value of the first output voltage, said second shift stage including said circuit branch including the voltage dropper.

7. The column selector of claim 5, wherein each voltage dropper is a transistor having a control terminal configured to receive said bias voltage.

8. The column selector of claim 5, wherein a value of the bias voltage is in direct relationship with a value of at least one of the first supply voltage and the second supply voltage.

9. The column selector of claim 5, wherein the first supply voltage and the second supply voltage are set according to an operation to be performed by the semiconductor memory device.

10. A semiconductor memory device, comprising:

a plurality of memory cells arranged in rows and columns;

a plurality of bit lines associated respectively with the columns of memory cells; and a column selector configured to select at least one bit line of the bit lines in response to a received address code, the column selector including:

a plurality of switches associated respectively with the bit lines and configured to be selectively controlled through corresponding switch control signals, respectively, for selecting the respective bit lines;

a plurality of level shifters associated respectively with the switches and configured to generate the corresponding switch control signals, respectively, based on respective selection signals based on the address code, wherein each level shifter includes:

first and second supply inputs for receiving a first supply voltage and a second supply voltage, respectively;

a shifting circuit configured to receive a corresponding one of the selection signals and set the corresponding switch control signal to a selected one of the first supply voltage and the second supply voltage according to a value of the corresponding selection signal, the shifting circuit including a circuit branch connected between the first supply input and the second supply input, said circuit branch including a plurality of series-connected electronic devices, and a voltage dropper device connected in series with the plurality of electronic devices and configured to introduce a voltage drop; and a bias generator configured to generate a bias voltage for the voltage dropper device according to values of the first supply voltage and the second supply voltage, said voltage drop depending on the bias voltage.

11. The semiconductor memory device of claim 10, wherein the shifting circuit of each level shifter comprises:

a first shift stage connected between the first supply input and a reference input providing a reference voltage, said first shift stage being configured to receive the corresponding selection signal and output a first output voltage corresponding to a selected one of the first supply voltage and the reference voltage according to a value of the corresponding selection signal; and a second shift stage connected between the first supply input and the second supply input, said second shift stage being configured to receive the first output voltage from the first shift stage, and set the corresponding switch control signal to a voltage corresponding to a selected one of the first supply voltage and the second supply voltage according to a value of the first output voltage, said second shift stage including said circuit branch including the voltage dropper.

12. The semiconductor memory device of claim 10, wherein each voltage dropper is a transistor having a control terminal configured to receive said bias voltage.

13. The semiconductor memory device of claim 10, wherein a value of the bias voltage is in direct relationship with a value of at least one of the first supply voltage and the second supply voltage.

14. The semiconductor memory device of claim 10, wherein the first supply voltage and the second supply voltage are set according to an operation to be performed by the semiconductor memory device.

15. The semiconductor memory device of claim 10, further including:

a plurality of word lines associated respectively with the rows of memory cells; and a row selector configured to bias a selected one of the word lines, selected in response to the received address code, to a row selection voltage, the row selection voltage having a value depending on bias voltage.

16. A method, comprising:

providing a first supply voltage and a second supply voltage to a first supply input and to a second supply input of a level shifter circuit, respectively;

providing an input voltage to a shifting circuit included in the level shifter circuit;

at the shifting circuit, outputting a selected one of the first supply voltage and the second supply voltage according to a value of the input voltage, the shifting circuit including a circuit branch connected between the first supply input and the second supply input, said circuit branch including a plurality of series-connected electronic devices, the step of outputting including:

generating a bias voltage according to values of the first supply voltage and the second supply voltage;

providing said bias voltage to a voltage dropper device connected in series with the plurality of electronic devices for introducing a voltage drop, wherein said voltage drop depends on the bias voltage.

17. A method according to claim 16, the method further comprising:

selecting bit lines of a semiconductor memory device in response to a received address code, the selecting including:

selectively controlling a plurality of switches respectively associated with bit lines through corresponding switch control signals, respectively, for selecting the respective bit lines;

providing a plurality of selection signals, respectively associated with the switches, to a plurality of level shifter circuits;

at each level shifter circuit, generating a corresponding one of the switch control signals according to the respective selection signals based on the address code, the step of generating said corresponding switch control signal including performing the steps of claim 16.

18. A method according to claim 17, further comprising:

managing the semiconductor memory device which a plurality of memory cells arranged in rows and columns, the semiconductor memory device including a plurality of bit lines, associated respectively with the columns of memory cells, and the column selector, the managing including:

at the column selector, receiving an address code and accordingly selecting at least one bit line of the bit lines according to the steps of claim 17.

19. The method of claim 18, further including setting values of the first supply voltage and the second supply voltage according to an operation to be performed by the semiconductor memory device.

20. The method of claim 18, wherein the semiconductor memory device further includes a plurality of word lines, respectively associated with the rows of memory cells, and a row selector configured to bias a selected one of the word lines, selected in response to the received address code, to a row selection voltage, the method further including setting a value of the row selection voltage based on the bias voltage.

21. An electronic system, comprising:

a processor;

input/output units for receiving and providing data; and a memory coupled to said processor, said memory including:

a plurality of memory cells arranged in rows and columns;

a plurality of bit lines associated respectively with the columns of memory cells; and a column selector configured to select at least one of the bit lines in response to a received address code, the column selector including:

a plurality of switches associated respectively with the bit lines and configured to be selectively controlled through corresponding switch control signals, respectively, for selecting the respective bit lines;

a plurality of level shifters associated respectively with the switches and configured to generate the corresponding switch control signals, respectively, based on respective selection signals based on the address code, wherein each level shifter includes:

first and second supply inputs for receiving a first supply voltage and a second supply voltage, respectively;

a shifting circuit configured to receive a corresponding one of the selection signals and set the corresponding switch control signals to a selected one of the first supply voltage and the second supply voltage according to a value of the corresponding selection signal, the shifting circuit including a circuit branch connected between the first supply input and the second supply input, said circuit branch including a plurality of series-connected electronic devices, and a voltage dropper device connected in series with the plurality of electronic devices and configured to introduce a voltage drop; and a bias generator configured to generate a bias voltage for the voltage dropper device according to values of the first supply voltage and the second supply voltage, said voltage drop depending on the bias voltage.

22. The system of claim 21, wherein the shifting circuit of each level shifter comprises:

a first shift stage connected between the first supply input and a reference input providing a reference voltage, said first shift stage being configured to receive the corresponding selection signal and output a first output voltage corresponding to a selected one of the first supply voltage and the reference voltage according to a value of the corresponding selection signal; and a second shift stage connected between the first supply input and the second supply input, said second shift stage being configured to receive the first output voltage from the first shift stage, and set the corresponding switch control signal to a voltage corresponding to a selected one of the first supply voltage and the second supply voltage according to a value of the first output voltage, said second shift stage including said circuit branch including the voltage dropper.

* * * * *